(12) United States Patent
Suzuki et al.

(10) Patent No.: US 11,133,203 B2
(45) Date of Patent: Sep. 28, 2021

(54) PLASMA PROCESSING APPARATUS

(71) Applicant: Tokyo Electron Limited, Tokyo (JP)

(72) Inventors: Satoshi Suzuki, Miyagi (JP); Akira Ishikawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 85 days.

(21) Appl. No.: 16/367,588

(22) Filed: Mar. 28, 2019

(65) Prior Publication Data

US 2019/0304815 A1 Oct. 3, 2019

(30) Foreign Application Priority Data

Mar. 29, 2018 (JP) .............................. JP2018-063605

(51) Int. Cl.
| | |
|---|---|
| H01L 21/67 | (2006.01) |
| H01L 21/683 | (2006.01) |
| H01L 21/687 | (2006.01) |
| H01L 21/3065 | (2006.01) |
| H01J 37/20 | (2006.01) |
| C23C 16/458 | (2006.01) |
| H01J 37/32 | (2006.01) |
| C23C 14/54 | (2006.01) |

(52) U.S. Cl.
CPC ...... *H01L 21/67109* (2013.01); *C23C 14/541* (2013.01); *C23C 16/4586* (2013.01); *H01J 37/20* (2013.01); *H01J 37/32724* (2013.01); *H01L 21/3065* (2013.01); *H01L 21/67063* (2013.01); *H01L 21/6833* (2013.01); *H01L 21/6838* (2013.01); *H01L 21/68785* (2013.01); *H01J 2237/2001* (2013.01)

(58) Field of Classification Search
None
See application file for complete search history.

(56) References Cited

U.S. PATENT DOCUMENTS

2015/0376783 A1\* 12/2015 Hanamachi ....... H01L 21/68792
    118/500
2016/0118285 A1\* 4/2016 Takada .............. H01L 21/67109
    361/234

FOREIGN PATENT DOCUMENTS

| JP | 2006-261541 A | 9/2006 |
| JP | 2011-151055 A | 8/2011 |
| JP | 2014-011382 A | 1/2014 |

\* cited by examiner

*Primary Examiner* — Karla A Moore
*Assistant Examiner* — Tiffany Z Nuckols
(74) *Attorney, Agent, or Firm* — Pearne & Gordon LLP (57) ABSTRACT

Temperature uniformity in a mounting surface of a mounting table is improved. A plasma processing apparatus includes the mounting table having thereon the mounting surface on which a work-piece serving as a plasma processing target is mounted; a coolant path formed within the mounting table along the mounting surface of the mounting table; and an inlet path connected to the coolant path from a backside of the mounting surface of the mounting table and configured to introduce a coolant into the coolant path. The inlet path is extended from the backside of the mounting surface of the mounting table such that an extension direction of the inlet path is inclined at an angle greater than 90° with respect to a flow direction of the coolant flowing through the coolant path, and then, connected to the coolant path.

1 Claim, 5 Drawing Sheets

PLASMA PROCESSING APPARATUS

CROSS-REFERENCE TO RELATED APPLICATION

This application claims the benefit of Japanese Patent Application No. 2018-063605 filed on Mar. 29, 2018, the entire disclosure of which is incorporated herein by reference.

TECHNICAL FIELD

The embodiments described herein pertain generally to a plasma processing apparatus.

BACKGROUND

Conventionally, there has been known a plasma processing apparatus configured to perform plasma processing, such as etching, on a work-piece, such as a semiconductor wafer, with plasma. In the plasma processing apparatus, a coolant path is provided within a mounting table, on which the work-piece is placed, along a mounting surface of the mounting table to perform a temperature control on the work-piece. An inlet path is connected to the coolant path from a backside of the mounting surface of the mounting table, so that a coolant is introduced into the coolant path from the inlet path.

Patent Document 1: Japanese Patent Laid-open Publication No. 2006-261541
Patent Document 2: Japanese Patent Laid-open Publication No. 2011-151055
Patent Document 3: Japanese Patent Laid-open Publication No. 2014-011382

SUMMARY

The embodiments disclosed herein provide a technology capable of improving the temperature uniformity in a mounting surface of a mounting table.

A plasma processing apparatus includes a mounting table having thereon a mounting surface on which a work-piece serving as a plasma processing target is mounted; a coolant path formed within the mounting table along the mounting surface of the mounting table; and an inlet path connected to the coolant path from a backside of the mounting surface of the mounting table and configured to introduce a coolant into the coolant path. The inlet path is extended from the backside of the mounting surface of the mounting table such that an extension direction of the inlet path is inclined at an angle greater than 90° with respect to a flow direction of the coolant flowing through the coolant path, and then, connected to the coolant path.

According to the exemplary embodiments of the plasma processing apparatus disclosed herein, it is possible to obtain the effect of improving the temperature uniformity in the mounting surface of the mounting table.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of a plasma processing apparatus disclosed herein will be described in detail with reference to the accompanying drawings. Further, the present disclosure is not limited to the exemplary embodiments.

Conventionally, there has been known a plasma processing apparatus configured to perform plasma processing, such as etching, on a work-piece, such as a semiconductor wafer, with plasma. In the plasma processing apparatus, a coolant path is provided within a mounting table, on which the work-piece is placed, along a mounting surface of the mounting table to perform a temperature control on the work-piece. An inlet path is connected to the coolant path from a backside of the mounting surface of the mounting table, so that a coolant is introduced into the coolant path from the inlet path.

However, if the inlet path is connected to the coolant path from the backside of the mounting surface of the mounting table, a flow velocity of the coolant is locally increased around a region, facing a connection portion between the inlet path and the coolant path, of an inner wall of the coolant path. Therefore, a thermal boundary layer serving as a thermal resistance may not be formed or may become thinner. For this reason, around the region, facing the connection portion between the inlet path and the coolant path, of the inner wall of the coolant path, heat transfer from the mounting surface of the mounting table to the coolant is locally promoted, so that the temperature uniformity in the mounting surface of the mounting table is deteriorated.

First Exemplary Embodiment

[Configuration of Plasma Processing Apparatus]

Figure 1:
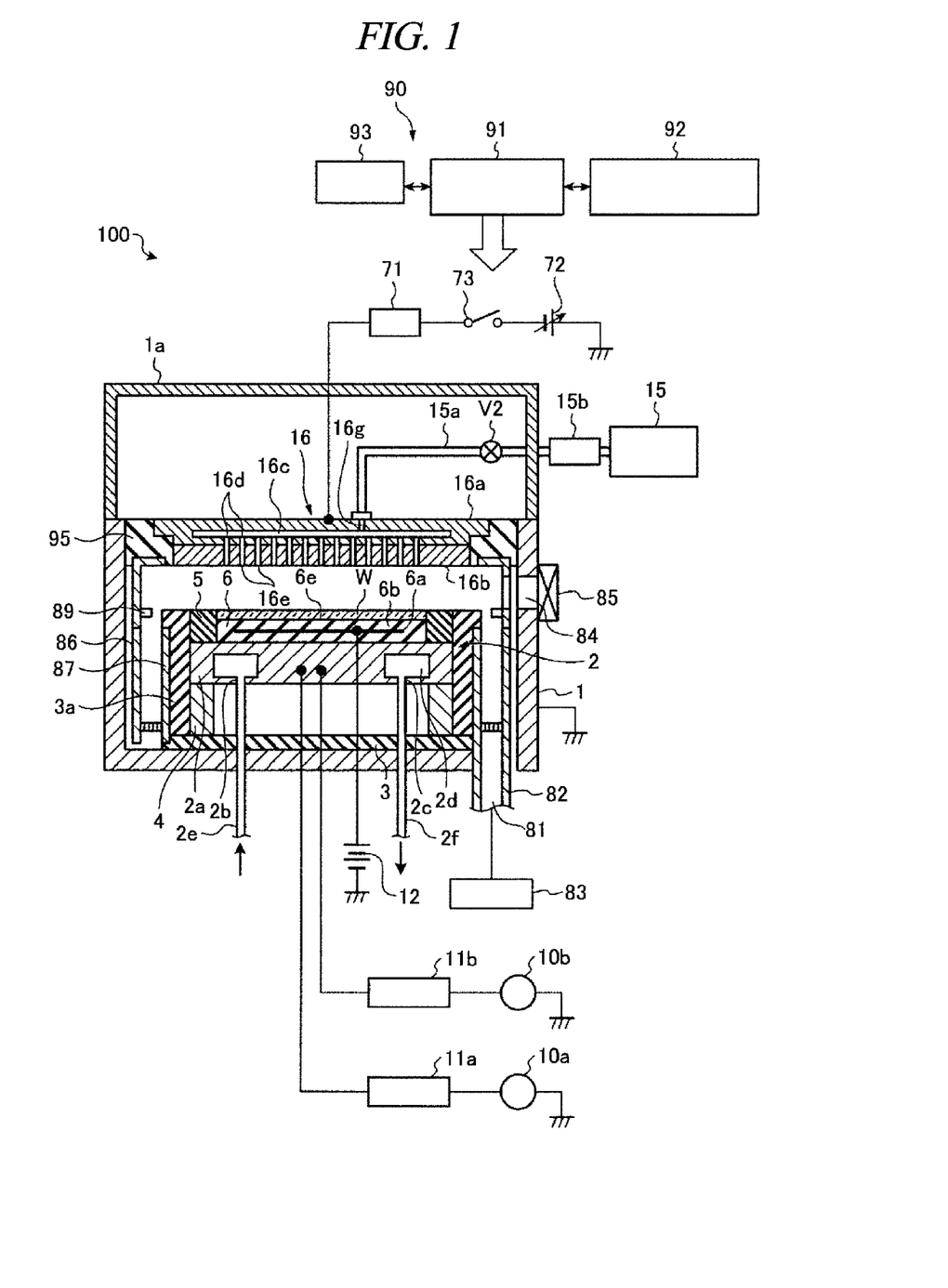
FIG. 1 is a schematic cross sectional view illustrating a configuration of a plasma processing apparatus according to an exemplary embodiment.

FIG. 1 is a schematic cross sectional view illustrating a configuration of a plasma processing apparatus according to the present exemplary embodiment. A plasma processing apparatus 100 includes a processing chamber 1 configured to be airtightly sealed and electrically grounded. The processing chamber 1 has a cylindrical shape and is made of, e.g., aluminum. The processing chamber 1 partitions a processing space where plasma is generated. Within the processing chamber 1, there is provided a mounting table 2 configured to horizontally mount thereon a semiconductor wafer (hereinafter, simply referred to as "wafer") W serving as a work-piece. The mounting table 2 includes a base 2a and an electrostatic chuck 6 (ESC). The base 2a is made of a conductive metal such as aluminum or the like and serves as a lower electrode. The electrostatic chuck 6 is configured to electrostatically attract the wafer W. The mounting table 2 is supported by a support 4. The support 4 is supported by a supporting member 3 made of, e.g., quartz. Further, a focus ring 5 made of, e.g., single crystalline silicon is provided on an upper periphery portion of the mounting table 2. Furthermore, within the processing chamber 1, a cylindrical inner wall member 3a made of, e.g., quartz is provided to surround the mounting table 2 and the support 4.

The base 2a is connected to a first RF power supply 10a via a first matching unit 11a, and also connected to a second RF power supply 10b via a second matching unit 11b. The first RF power supply 10a is provided for plasma generation and configured to supply a high frequency power having a predetermined frequency to the base 2a of the mounting table 2. Further, the second RF power supply 10b is provided for ion attraction (for bias) and configured to supply a high frequency power having a predetermined frequency lower than that of the first RF power supply 10a to the base 2a of the mounting table 2. As such, a voltage can be applied to the mounting table 2. Meanwhile, above the mounting table 2, a shower head 16 serving as an upper electrode is provided to face the mounting table 2 in parallel to each other. The shower head 16 and the mounting table 2 are configured to serve as a pair of electrodes (upper electrode and lower electrode).

The electrostatic chuck 6 has a flat disc-shaped upper surface, and the upper surface serves as a mounting surface 6e on which the wafer W is mounted. The electrostatic chuck 6 includes an electrode 6a embedded within insulators 6b, and the electrode 6a is connected to a DC power supply 12. Further, a DC voltage is applied from the DC power supply 12 to the electrode 6a, so that the wafer W is attracted by a Coulomb force.

Within the base 2a, a coolant path 2d is formed. One end of the coolant path 2d is connected to an inlet path 2b and the other end thereof is connected to an outlet path 2c. The inlet path 2b and the outlet path 2c are connected to a non-illustrated chiller unit via a coolant inlet line 2e and a coolant outlet line 2f, respectively. The coolant path 2d is located under the wafer W and configured to absorb heat of the wafer W. The plasma processing apparatus 100 is configured to control the mounting table 2 to have a predetermined temperature by circulating a coolant, e.g., cooling water or an organic solvent such as Galden, supplied from the chiller unit through the coolant path 2d. The structures of the coolant path 2d, the inlet path 2b, and the outlet path 2c will be described later.

Further, the plasma processing apparatus 100 may be configured to supply a cold heat transfer gas to a backside of the wafer W to independently control the temperature. For example, a gas supply line, through which the cold heat transfer gas (backside gas) such as a helium gas or the like is supplied to the rear surface of the wafer W, may be provided to pass through the mounting table 2. The gas supply line is connected to a non-illustrated gas supply source. With this configuration, the wafer W attracted to and held on the upper surface of the mounting table 2 by the electrostatic chuck 6 is controlled to have a predetermined temperature.

The shower head 16 is provided at a ceiling wall of the processing chamber 1. The shower head 16 includes a main body 16a and an upper ceiling plate 16b serving as an electrode plate, and is supported at an upper portion of the processing chamber 1 with an insulating member 95 therebetween. The main body 16a is made of a conductive material, e.g., aluminum having an anodically oxidized surface, and configured to support the upper ceiling plate 16b on a lower portion thereof in a detachable manner.

A gas diffusion space 16c is formed within the main body 16a. Further, multiple gas through holes 16d are formed in a bottom portion of the main body 16a to be extended from the gas diffusion space 16c. Furthermore, gas discharge holes 16e passing through the upper ceiling plate 16b in a thickness direction thereof are formed to communicate with the gas through holes 16d, respectively. With this configuration, a processing gas supplied into the gas diffusion space 16c is dispersed in a shower shape and supplied into the processing chamber 1 through the gas through holes 16d and the gas discharge holes 16e.

A gas inlet opening 16g through which a processing gas is introduced into the gas diffusion space 16c is formed in the main body 16a. The gas inlet opening 16g is connected to one end of a gas supply line 15a. A processing gas supply source (gas supplying unit) 15 configured to supply a processing gas is connected to the other end of the gas supply line 15a. A mass flow controller (MFC) 15b and an opening/closing valve V2 are sequentially provided from an upstream side at the gas supply line 15a. A processing gas for plasma etching is supplied into the gas diffusion space 16c through the gas supply line 15a from the processing gas supply source 15. The processing gas is dispersed in a shower shape and supplied into the processing chamber 1 through the gas through holes 16d and the gas discharge holes 16e from the gas diffusion space 16c.

A variable DC power supply 72 is electrically connected to the shower head 16 serving as the upper electrode via a low pass filter (LPF) 71. The variable DC power supply 72 is configured to turn on/off power supply by using an on/off switch 73. A current/voltage of the variable DC power supply 72 and an on/off operation of the on/off switch 73 are controlled by a control unit 90 to be described later. Further, as will be described later, when plasma is generated in the processing space by applying the high frequency powers from the first RF power supply 10a and the second RF power supply 10b to the mounting table 2, the on/off switch 73 is turned on by the control unit 90, if necessary, so that a predetermined DC voltage is applied to the shower head 16 serving as the upper electrode.

A cylindrical ground conductor 1a is provided to be upwardly extended from the side wall of the processing chamber 1 to a position higher than a height position of the shower head 16. The cylindrical ground conductor 1a has a ceiling wall at an upper portion thereof.

An exhaust opening 81 is formed at a bottom portion of the processing chamber 1. A first exhaust device 83 is connected to the exhaust opening 81 via an exhaust pipe 82. The first exhaust device 83 has a vacuum pump, and the inside of the processing chamber 1 can be decompressed to a predetermined vacuum level by operating the vacuum pump. Meanwhile, a carry-in/carry-out opening 84 for the wafer W is formed at the side wall of the processing chamber 1, and a gate valve 85 configured to open or close the carry-in/carry-out opening 84 is provided at the carry-in/carry-out opening 84.

On an inner sidewall of the processing chamber 1, a deposition shield 86 is provided along an inner wall surface. The deposition shield 86 is configured to suppress an etching by-product (deposit) from being attached on the processing chamber 1. At the deposition shield 86, a conductive member (GND block) 89, which is connected such that its potential with respect to the ground may be controlled, is provided at substantially the same height position as that of the wafer W, so that an abnormal electric discharge is suppressed. Further, at a lower end portion of the deposition shield 86, there is provided a deposition shield 87 extended along the inner wall member 3a. The deposition shields 86 and 87 are detachably attached.

An overall operation of the plasma processing apparatus 100 configured as described above is controlled by the control unit 90. The control unit 90 includes a process controller 91 that includes a CPU and controls each component of the plasma processing apparatus 100, a user interface 92, and a storage unit 93.

The user interface 92 includes a keyboard through which a process manager inputs a command to manage the plasma processing apparatus 100; and a display that visibly displays an operation status of the plasma processing apparatus 100.

The storage unit 93 stores a recipe of a control program (software) or processing condition data for implementing various processes executed in the plasma processing apparatus 100 to be performed under the control of the process controller 91. Then, if necessary, a desired process is performed in the plasma processing apparatus 100 under the control of the process controller 91 by retrieving a certain recipe from the storage unit 93 in response to an instruction or the like from the user interface 92 and executing the corresponding recipe in the process controller 91. Further, the recipe of the control program, the processing condition data, or the like may be stored in a computer-readable storage medium (for example, a hard disc, a CD, a flexible disc, a semiconductor memory, or the like), or may also be frequently transmitted on-line from another apparatus via, e.g., a dedicated line.

[Configuration of Mounting Table]

Figure 2:
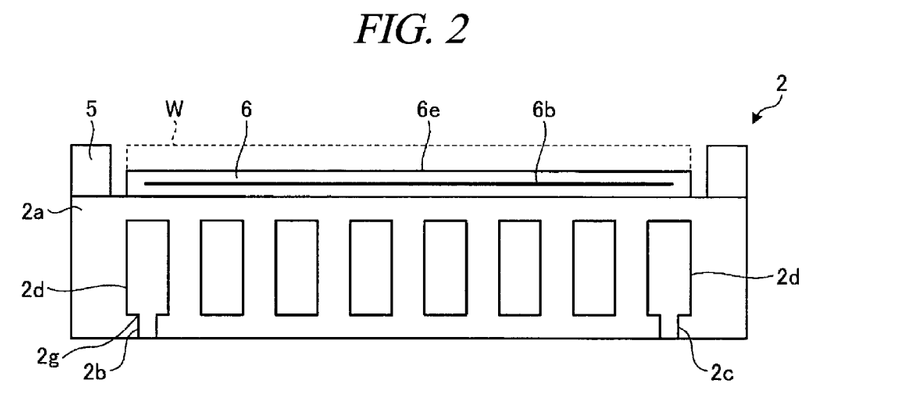
FIG. 2 is a schematic cross sectional view illustrating a configuration of main components of a mounting table according to the exemplary embodiment.

Hereafter, a configuration of main components of the mounting table 2 will be described with reference to FIG. 2. FIG. 2 is a schematic cross sectional view illustrating a configuration of main components of the mounting table 2 according to the present exemplary embodiment.

The mounting table 2 includes the base 2a and the electrostatic chuck 6. The electrostatic chuck 6 has a circular plate shape and is fixed to the base 2a to be coaxially arranged with the base 2a. The upper surface of the electrostatic chuck 6 serves as the mounting surface 6e on which the wafer W is mounted.

Within the base 2a, the coolant path 2d is provided along the mounting surface 6e. The plasma processing apparatus 100 is configured to control the temperature of the mounting table 2 by allowing the coolant to flow through the coolant path 2d.

Figure 3:
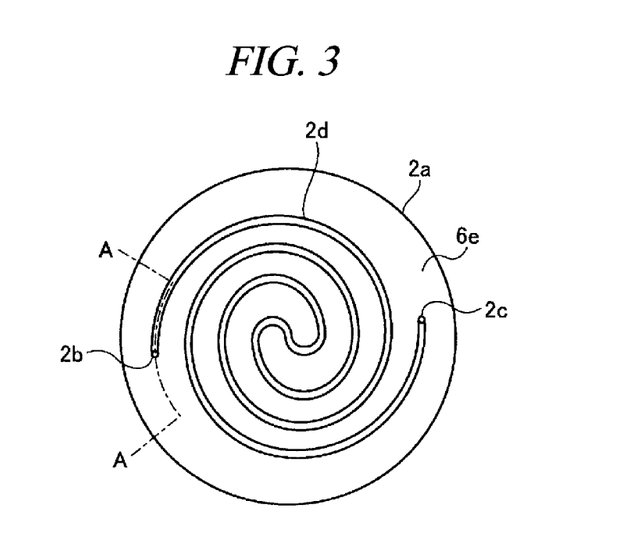
FIG. 3 is a plan view of the mounting table when viewed from the top.

FIG. 3 is a plan view of the mounting table 2 when viewed from the top. In FIG. 3, the mounting surface 6e of the mounting table 2 is illustrated as having a circular plate shape. The coolant path 2d is formed to have, e.g., a vortex shape in a region, corresponding to the mounting surface 6e, within the base 2a, as shown in FIG. 3. Thus, the plasma processing apparatus 100 can control the temperature of the wafer W on the entire mounting surface 6e of the mounting table 2.

Referring to FIG. 2 again, the inlet path 2b and the outlet path 2c are connected to the coolant path 2d from the backside of the mounting surface 6e of the mounting table 2. The inlet path 2b introduces the coolant into the coolant path 2d, and the outlet path 2c drains the coolant flowing through the coolant path 2d.

Figure 4:
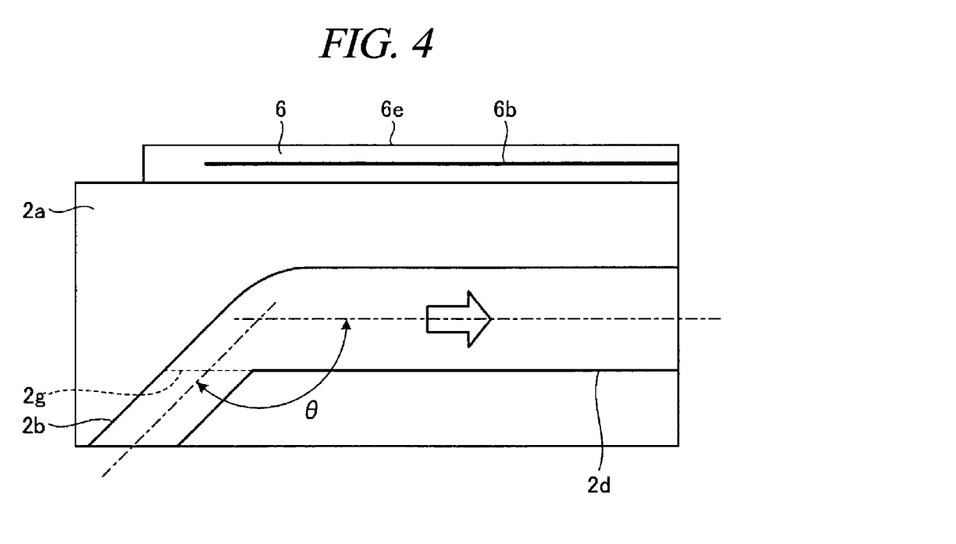
FIG. 4 is a diagram showing an example of connection between an inlet path and a coolant path.

Hereafter, an example of the connection between the inlet path 2b and the coolant path 2d will be described. FIG. 4 is a schematic cross sectional view showing an example of the connection between the inlet path 2b and the coolant path 2d. FIG. 4 corresponds to a cross sectional view taken along the line A-A of the base 2a of the mounting table 2 illustrated in FIG. 3. The inlet path 2b is extended from the backside of the mounting surface 6e of the mounting table 2 such that an extension direction of the inlet path 2b is inclined at an angle θ greater than 90° with respect to the flow direction of the coolant flowing through the coolant path 2d (as indicated by an arrow in FIG. 4), and then, connected to the coolant path 2d. The angle θ needs to be greater than 90° and, it is desirable that the angle θ is equal to or larger than 135° and equal to or smaller than 180°.

However, in the plasma processing apparatus 100, if the inlet path 2b is connected to the coolant path 2d from the backside of the mounting surface 6e of the mounting table 2, the temperature uniformity in the mounting surface 6e of the mounting table 2 may be deteriorated.

Figure 5:
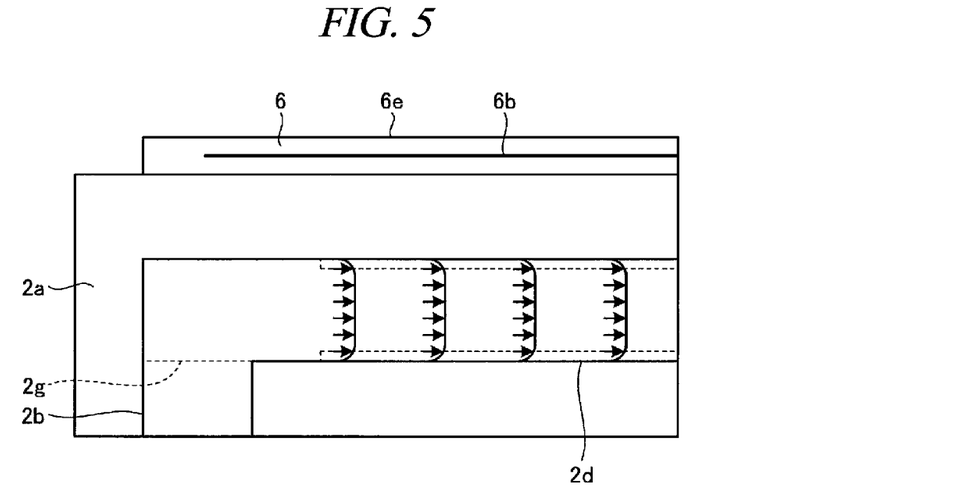
FIG. 5 is a diagram schematically showing a state of a coolant which flows through a coolant path.

FIG. 5 is a diagram schematically showing a state of a coolant which flows through the coolant path 2d. As shown in FIG. 5, the coolant path 2d is provided within the base 2a along the mounting surface 6e of the mounting table 2. Further, the inlet path 2b is connected to the coolant path 2d from the backside of the mounting surface 6e of the mounting table 2. The inlet path 2b is extended from the backside of the mounting surface 6e of the mounting table 2 such that an extension direction of the inlet path 2b is orthogonal to a flow direction of the coolant flowing through the coolant path 2d, and then, connected to the coolant path 2d. In the plasma processing apparatus 100 in which the inlet path 2b is connected to the coolant path 2d from the backside of the mounting surface 6e of the mounting table 2, the flow direction of the coolant is changed between the inlet path 2b and the coolant path 2d. When the flow direction of the coolant is changed between the inlet path 2b and the coolant path 2d, a flow velocity of the coolant is locally increased around the region, facing the connection portion 2g between the coolant path 2d and the inlet path 2b, of the inner wall of the coolant path 2d. Therefore, a thermal boundary layer serving as a thermal resistance may not be formed or may become thinner. Meanwhile, in the other region except the region, facing the connection portion 2g, of the inner wall of the coolant path 2d, a velocity of the coolant is lower than that in the region, facing the connection portion 2g, of the inner wall of the coolant path 2d, and, thus, the thermal boundary layer serving as the thermal resistance is formed. In FIG. 5, the thermal boundary layer formed in the other region except the region, facing the connection portion 2g, of the inner wall of the coolant path 2d is illustrated as a layer indicated by a broken line. For example, in the plasma processing apparatus 100, when a difference in the flow velocity of the coolant between in the region, facing the connection portion 2g, of the inner wall of the coolant path 2d and the other region thereof is excessively increased, a difference in the thickness of a thermal boundary layer is excessively increased. For this reason, around the region, facing the connection portion 2g, of the inner wall of the coolant path 2d, heat transfer from the mounting surface 6e to the coolant is locally promoted, so that the temperature uniformity in the mounting surface 6e of the mounting table 2 is deteriorated.

Therefore, in the plasma processing apparatus 100, the inlet path 2b is connected to the coolant path 2d such that the inlet path 2b is inclined at an angle θ greater than 90° with respect to the flow direction of the coolant flowing through the coolant path 2d, as shown in FIG. 4.

[Change in Flow Velocity Distribution of Coolant Depending on Inclination of Inlet Path]

Figure 6:
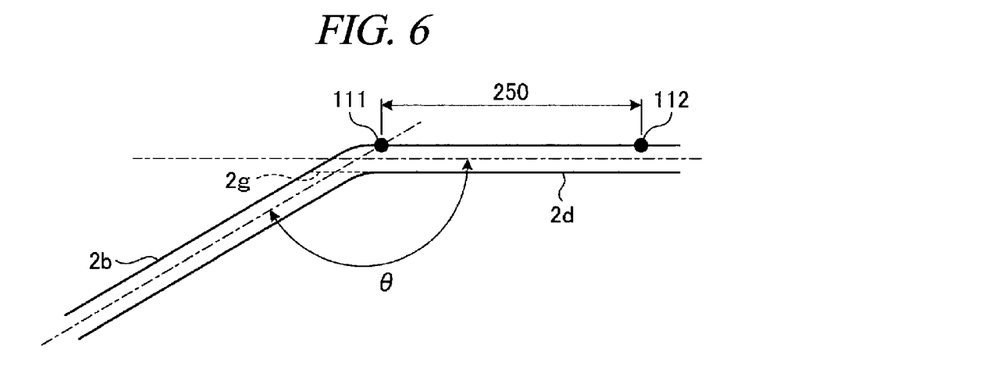
FIG. 6 is a diagram showing an example of a model for simulating a correlation between an angle θ and a difference in a flow velocity of the coolant between in a region, facing a connection portion, of an inner wall of a coolant path and in the other region thereof.
Figure 7:
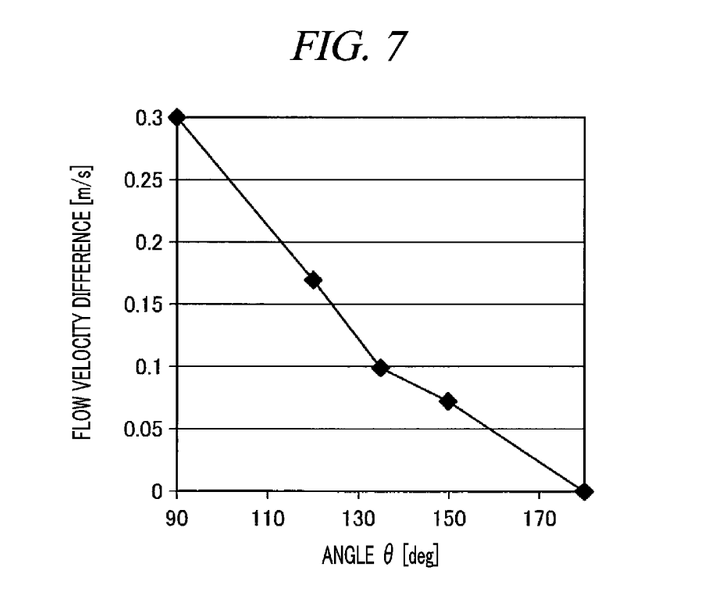
FIG. 7 is a diagram showing an example of a simulation result for the correlation between the angle θ and the difference in the flow velocity of the coolant between in the region, facing the connection portion, of the inner wall of the coolant path and in the other region thereof.

FIG. 6 and FIG. 7 are provided to explain a change in a flow velocity distribution of the coolant caused by connecting the inlet path 2b to the coolant path 2d such that the inlet path 2b is inclined at an angle θ greater than 90° with respect to the flow direction of the coolant flowing through the coolant path 2d. FIG. 6 is a diagram showing an example of a model for simulating a correlation between the angle θ and the difference in the flow velocity of the coolant between in the region, facing the connection portion 2g, of the inner wall of the coolant path 2d and in the other region thereof. FIG. 7 is a diagram showing an example of a simulation result for the correlation between the angle θ and the difference in the flow velocity of the coolant between in the region, facing the connection portion 2g, of the inner wall of the coolant path 2d and in the other region thereof. FIG. 7 is obtained from the simulation using the model shown in FIG. 6.

FIG. 6 shows a configuration where the inlet path 2b is connected to the coolant path 2d such that the inlet path 2b is inclined at an angle θ with respect to the flow direction of the coolant flowing through the coolant path 2d. Further, in the model shown in FIG. 6, a measurement point 111 and a measurement point 112 are set at a distance of 250 mm from each other and 1 mm away from an upper surface of the inner wall of the coolant path 2d in order to measure the flow velocity of the coolant in the region, facing the connection portion 2g, of the inner wall of the coolant path 2d and the other region thereof. The flow velocity of the coolant measured from the measurement point 111 corresponds to the flow velocity of the coolant in the region, facing the connection portion 2g, of the inner wall of the coolant path 2d. The flow velocity of the coolant measured from the measurement point 112 corresponds to the flow velocity of the coolant in the other region except the region, facing the connection portion 2g, of the inner wall of the coolant path 2d. Further, as conditions for the simulation using the model shown in FIG. 6, water is used as the coolant and a mass flow rate of the coolant is 0.6 kg/s and a width of the inlet path 2b and the coolant path 2d is 21.5 mm.

FIG. 7 shows a result of measuring the difference in the flow velocity of the coolant between in the region, facing the connection portion 2g, of the inner wall of the coolant path 2d and the other region thereof by changing the angle θ to, e.g., 90°, 120°, 135°, 150°, and 180°, respectively. As shown in FIG. 7, when the angle θ is greater than 90°, the difference in the flow velocity of the coolant between in the region, facing the connection portion 2g, of the inner wall of the coolant path 2d and the other region thereof is decreased as compared with a case where the angle θ is 90°. Particularly, when the angle θ is in the range of from 135° to 180°, the difference in the flow velocity of the coolant between in the region, facing the connection portion 2g, of the inner wall of the coolant path 2d and the other region thereof is decreased to ½ as compared with the case where the angle θ is 90°. As such, if the inlet path 2b is connected to the coolant path 2d such that the inlet path 2b is inclined at an angle θ greater than 90° with respect to the flow direction of the coolant flowing through the coolant path 2d, the difference in the flow velocity of the coolant between in the region, facing the connection portion 2g, of the inner wall of the coolant path 2d and the other region thereof can be reduced. Thus, the difference in the thickness of the thermal boundary layer around the inner wall of the coolant path 2d can be reduced. Accordingly, heat can be uniformly transferred from the entire mounting surface 6e of the mounting table 2 to the coolant. As a result, it is possible to improve the temperature uniformity in the mounting surface 6e of the mounting table 2.

As described above, the plasma processing apparatus 100 according to the exemplary embodiment includes the mounting table 2, the coolant path 2d, and the inlet path 2b. The mounting table 2 has the mounting surface 6e on which the wafer W serving as a plasma processing target is mounted. The coolant path 2d is provided within the mounting table 2 along the mounting surface 6e of the mounting table 2. The inlet path 2b is connected to the coolant path 2d from the backside of the mounting surface 6e of the mounting table 2 and introduces the coolant into the coolant path 2d. In the plasma processing apparatus 100, the inlet path 2b is extended from the backside of the mounting surface 6e of the mounting table 2 such that an extension direction of the inlet path 2b is inclined at the angle θ greater than 90° with respect to the flow direction of the coolant flowing through the coolant path 2d, and then, connected to the coolant path 2d. Thus, the plasma processing apparatus 100 can improve the temperature uniformity in the mounting surface 6e of the mounting table 2.

There have been described various exemplary embodiments. However, the present disclosure is not limited to the above-described exemplary embodiments and can be modified and changed in various ways.

Figure 8:
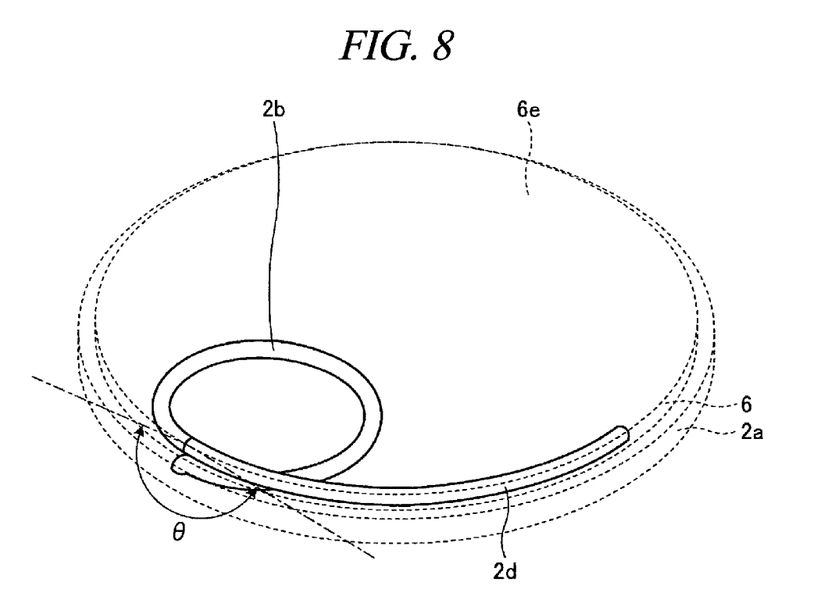
FIG. 8 is a diagram showing another example of the connection between the inlet path and the coolant path.

For example, in the above-described exemplary embodiments, there has been described the example where the extension direction of the whole inlet path 2b is inclined at the angle θ greater than 90° with respect to the flow direction of the coolant flowing through the coolant path 2d, but the whole inlet path 2b may not be inclined at the angle θ greater than 90°. As illustrated in FIG. 8, the inlet path 2b may be spirally extended from the backside of the mounting surface 6e of the mounting table 2 such that an extension direction of an end portion of the inlet path 2b is inclined at the angle θ greater than 90° with respect to the flow direction of the coolant flowing through the coolant path 2d, and then, connected to the coolant path 2d. Further, FIG. 8 is a diagram showing another example of the connection between the inlet path 2b and the coolant path 2d.

Besides, the above-described plasma processing apparatus 100 is a capacitively coupled plasma processing apparatus, but may be applied to any plasma processing apparatus. For example, the plasma processing apparatus 100 may be any type of plasma processing apparatus such as an inductively coupled plasma processing apparatus or a plasma processing apparatus that excites a gas with a surface wave such as a microwave.

Further, in the above-described exemplary embodiment, there has been described the example where the first RF power supply 10*a* and the second RF power supply 10*b* are connected to the base 2*a*, but the configuration of the plasma source is not limited thereto. For example, the first RF power supply 10*a* for plasma generation may be connected to the shower head 16 serving as the upper electrode. Further, the second RF power supply 10*b* for ion attraction (for bias) may not be connected to the base 2*a*.

Furthermore, the above-described plasma processing apparatus 100 is a plasma processing apparatus that performs etching as a plasma processing, but may be applied to a plasma processing apparatus that performs any plasma processing. For example, the plasma processing apparatus 100 may be a single-substrate deposition apparatus that performs chemical vapor deposition (CVD), atomic layer deposition (ALD), physical vapor deposition (PVD), or the like or may be a plasma processing apparatus that performs plasma annealing, plasma implantation, or the like.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A plasma processing apparatus, comprising:
a mounting table having thereon a mounting surface on which a work-piece serving as a plasma processing target is mounted;
a coolant path formed within the mounting table along the mounting surface of the mounting table; and
an inlet path connected to the coolant path from a backside of the mounting surface of the mounting table and configured to introduce a coolant into the coolant path,
wherein the inlet path extending between the backside of the mounting surface of the mounting table and the coolant path has a complete spiral shape such that an angle between an end portion of the inlet path at the backside of the mounting surface and the coolant path is greater than 90°.

\* \* \* \* \*